United States Patent
Nagasaki

(10) Patent No.: US 8,300,422 B2
(45) Date of Patent: Oct. 30, 2012

(54) PRINTED CIRCUIT BOARD EQUIPPED WITH PIEZOELECTRIC ELEMENT

(75) Inventor: Osamu Nagasaki, Numazu (JP)

(73) Assignee: Canon Kabushiki Kaisha, Tokyo (JP)

( * ) Notice: Subject to any disclaimer, the term of this patent is extended or adjusted under 35 U.S.C. 154(b) by 234 days.

(21) Appl. No.: 12/762,123

(22) Filed: Apr. 16, 2010

(65) Prior Publication Data

US 2010/0290203 A1  Nov. 18, 2010

(30) Foreign Application Priority Data

May 15, 2009   (JP) ................. 2009-119073

(51) Int. Cl.
 *H05K 7/02* (2006.01)
 *H01L 41/107* (2006.01)
(52) U.S. Cl. ........ 361/767; 361/760; 361/764; 361/783; 361/794; 323/222; 323/355; 363/21.13; 363/61; 310/316.01; 310/348
(58) Field of Classification Search .......... 361/760–767, 361/783–784, 794, 807–810, 836; 310/344, 310/316.01, 318, 319, 348; 323/222, 268, 323/271, 282, 285, 288, 355; 363/21.13, 363/59, 60, 61, 40, 124, 16, 97, 131; 174/254–264
See application file for complete search history.

(56) References Cited

U.S. PATENT DOCUMENTS

| | | | | |
|---|---|---|---|---|
| 6,003,976 A * | 12/1999 | Tani et al. | | 347/55 |
| 6,037,705 A * | 3/2000 | Kawabata et al. | | 310/345 |
| 6,229,720 B1 * | 5/2001 | Noma et al. | | 363/40 |
| 6,914,365 B1 * | 7/2005 | Chou et al. | | 310/318 |
| 7,557,488 B2 * | 7/2009 | Yamaguchi | | 310/318 |
| 2006/0220495 A1 * | 10/2006 | Yamaguchi et al. | | 310/318 |
| 2007/0024254 A1 * | 2/2007 | Radecker et al. | | 323/247 |
| 2009/0160424 A1 | 6/2009 | Yamamoto | | 323/355 |
| 2010/0135698 A1 * | 6/2010 | Nemoto | | 399/168 |

FOREIGN PATENT DOCUMENTS

| | | | |
|---|---|---|---|
| JP | 409214096 A * | 1/1996 | |
| JP | 11-206113 | 7/1999 | |
| JP | 2008-193804 | 8/2008 | |
| JP | 2008251815 A * | 10/2008 | |
| JP | 20099130311 A * | 6/2009 | |
| JP | 2009-153293 | 7/2009 | |

* cited by examiner

*Primary Examiner* — Michail V Datskovskiy

(74) *Attorney, Agent, or Firm* — Fitzpatrick, Cella, Harper & Scinto

(57) ABSTRACT

An electronic apparatus includes, for example, a circuit board with an electronic component and a piezoelectric element, a reference potential pattern that gives a reference potential to at least one of the electronic component and the piezoelectric element, and a solder land connected to the reference potential pattern. On the circuit board, the electronic component is located on a downstream side in a transport direction of the circuit board during mounting of the piezoelectric element and the electronic component on the solder land, and the piezoelectric element is located on an upstream side in the transport direction.

31 Claims, 11 Drawing Sheets

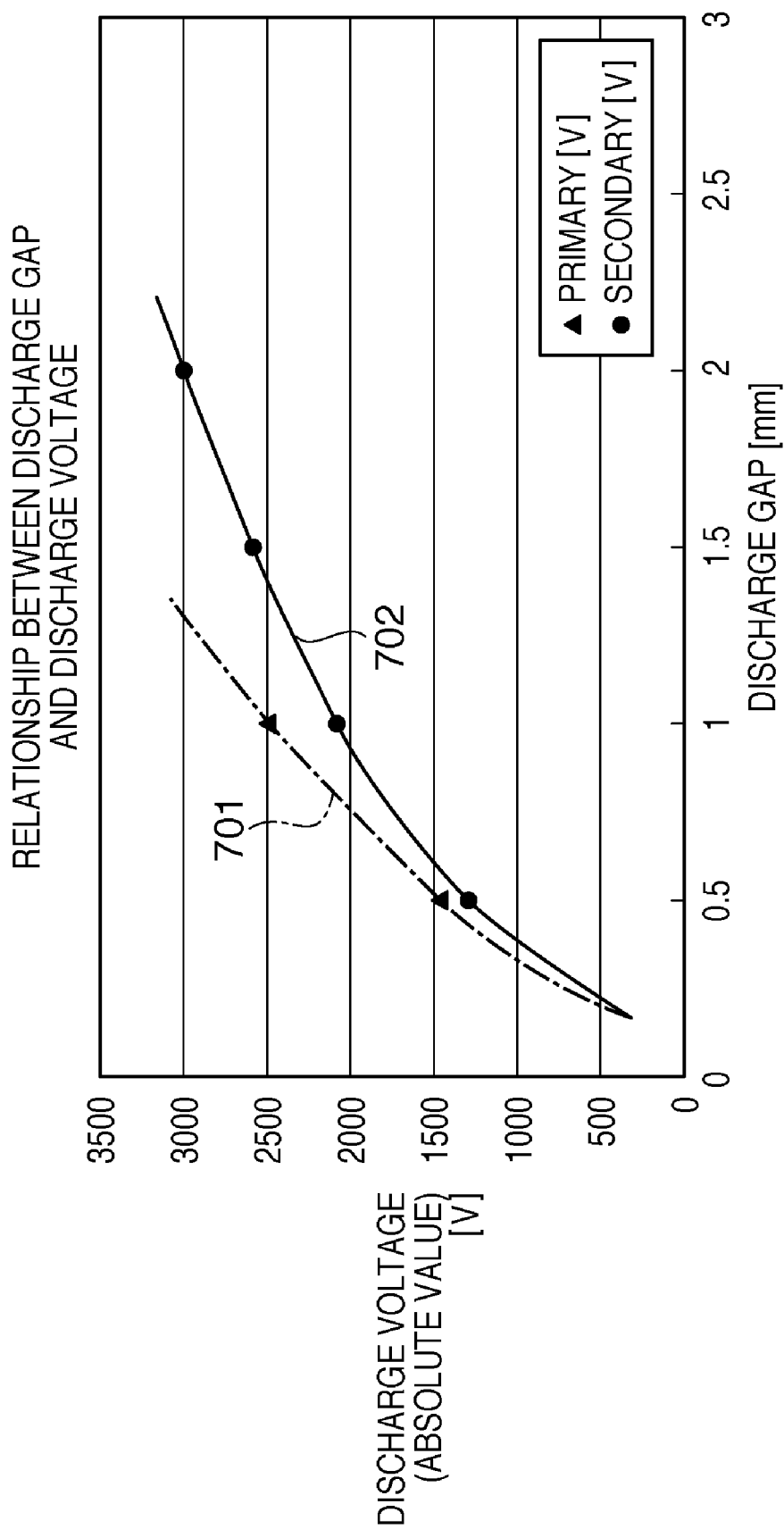

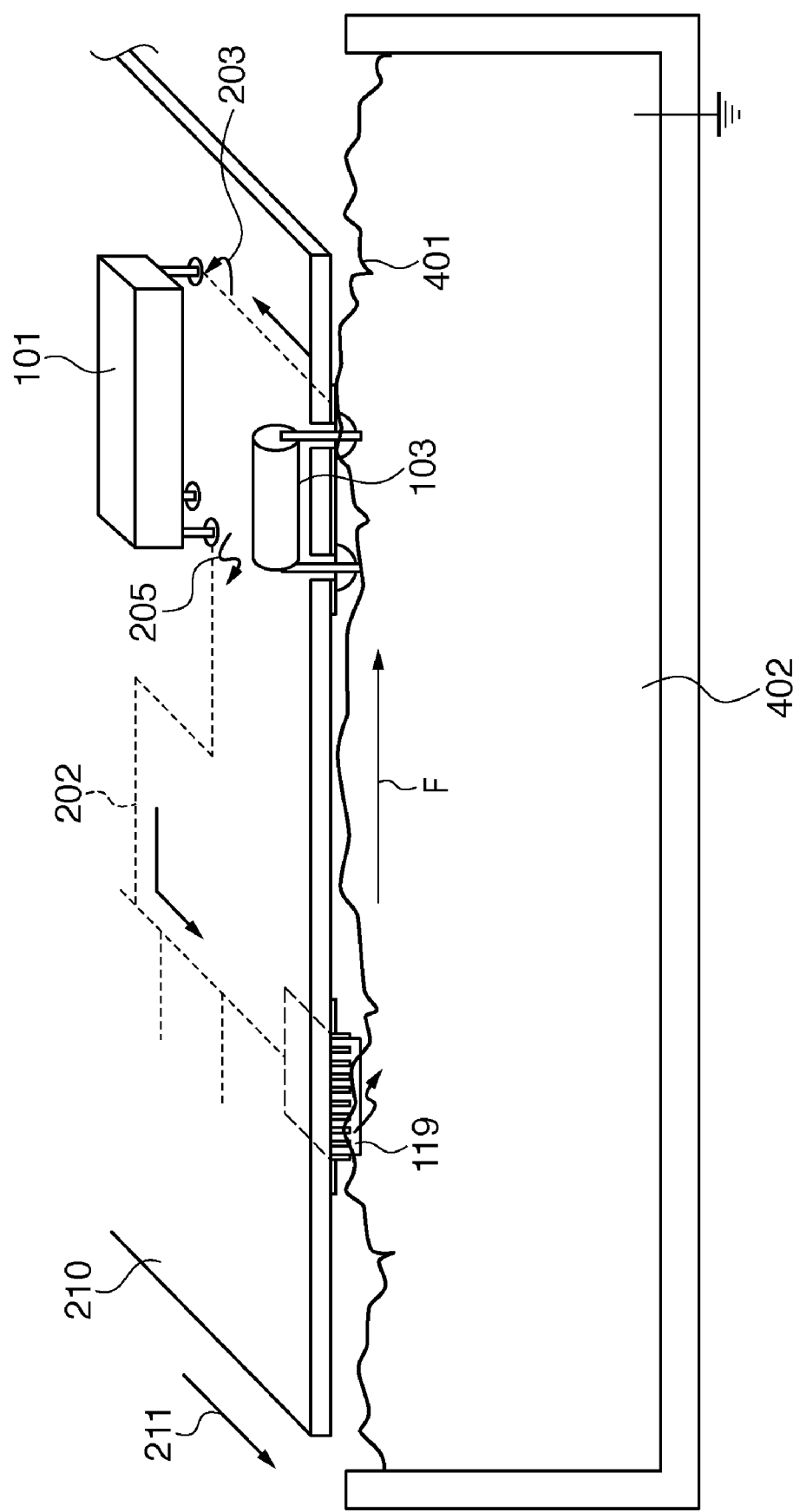

PRINTED CIRCUIT BOARD EQUIPPED WITH PIEZOELECTRIC ELEMENT

BACKGROUND OF THE INVENTION

1. Field of the Invention

The present invention relates to a printed circuit board with piezoelectric elements.

2. Description of the Related Art

In an electrophotographic image forming apparatus, for good image transfer to a sheet, a high voltage (a voltage of several hundred volts or more, which is higher than a commercial power supply voltage) is generally applied to a transfer roller, and a current of approximately 10 μA is applied to the transfer roller. To generate such a high voltage, conventionally a wound-rotor type electromagnetic transformer has been used. The wound-rotor type electromagnetic transformer is, however, difficult to reduce in size and weight. To further reduce the size and weight of an electronic apparatus such as an image forming apparatus, the size and weight of a power supply that generates a high voltage must be reduced. To achieve a reduction in the size and weight of a power supply, the use of a piezoelectric transformer (a piezoelectric ceramic configured as a transformer with electrodes) is being considered instead of using the wound-rotor type electromagnetic transformer. A piezoelectric transformer is capable of generating a high voltage with higher efficiency than the electromagnetic transformer and furthermore does not require molding for providing isolation between primary and secondary electrodes. Thus, the piezoelectric transformer brings the advantage that the power supply is reduced in size and weight (Japanese Patent Laid-Open No. 11-206113).

SUMMARY OF THE INVENTION

For the manufacture of a circuit board that is incorporated into an electronic apparatus, flow soldering is known as a method for soldering electronic components to a printed circuit board. Flow soldering is a soldering method implemented by coating a flux to a printed circuit board with electronic components and then dipping the board into a flow soldering bath that contains molten solder. More specifically, soldering is implemented by forming a jet of molten solder (a solder jet flow) in a flow soldering bath and bringing a board into contact with the top of the solder jet flow. In the course of preheating and passage through the flow soldering bath in this flow soldering process, the piezoelectric transformer is heated to as high as several hundred degrees. A piezoelectric element that is heated to a high temperature generates a high voltage at a terminal of a piezoelectric transformer due to its pyroelectric effect. Specifically, a spark discharge is generated in a gap provided between a primary terminal of the piezoelectric transformer and a solder land. A discharge voltage at this time reaches a value of approximately several hundred to several thousand volts. Also, although the amount of charge accumulated on a secondary terminal of the piezoelectric transformer is small and thus does not develop into sparks, a discharge voltage of several hundred volts to several thousand volts is still generated at that terminal.

In contrast, electrostatic withstand voltages at terminals of electronic components (semiconductor components) such as LSIs and transistors are approximately on the order of several hundred volts. Thus, at the time of the above discharge generated due to the pyroelectric effect, semiconductor components that are direct extensions of solder lands provided for the terminals of a piezoelectric transformer may be broken due to the application of a voltage that exceeds their electrostatic withstand voltages.

The present invention thus aims to solve at least one of such a problem and other problems. For example, the present invention enables a semiconductor component to be protected from discharge with the use of a low-cost and simple method, the discharge being generated from a piezoelectric element due to the pyroelectric effect of the element during a flow soldering process. Note that the other problems will be understood through the entire specification.

According to the present invention, an electronic apparatus includes, for example, a circuit board with an electronic component and a piezoelectric element, a reference potential pattern that gives a reference potential to at least one of the electronic component and the piezoelectric element, and a solder land connected to the reference potential pattern. On the circuit board, the electronic component is located on a downstream side in a transport direction of the circuit board during mounting of the piezoelectric element and the electronic component on a solder land, and the piezoelectric element is located on an upstream side in the transport direction.

Further features of the present invention will become apparent from the following description of exemplary embodiments (with reference to the attached drawings).

BRIEF DESCRIPTION OF THE DRAWINGS

FIG. 13 illustrates an example of actual measurement results obtained by measuring a change in discharge voltage according to a discharge gap.

FIG. 15 is a diagram illustrating another example case of an undesirable effect of mounting associated with discharge generated due to the pyroelectric effect.

DESCRIPTION OF THE EMBODIMENTS

Figure 1:
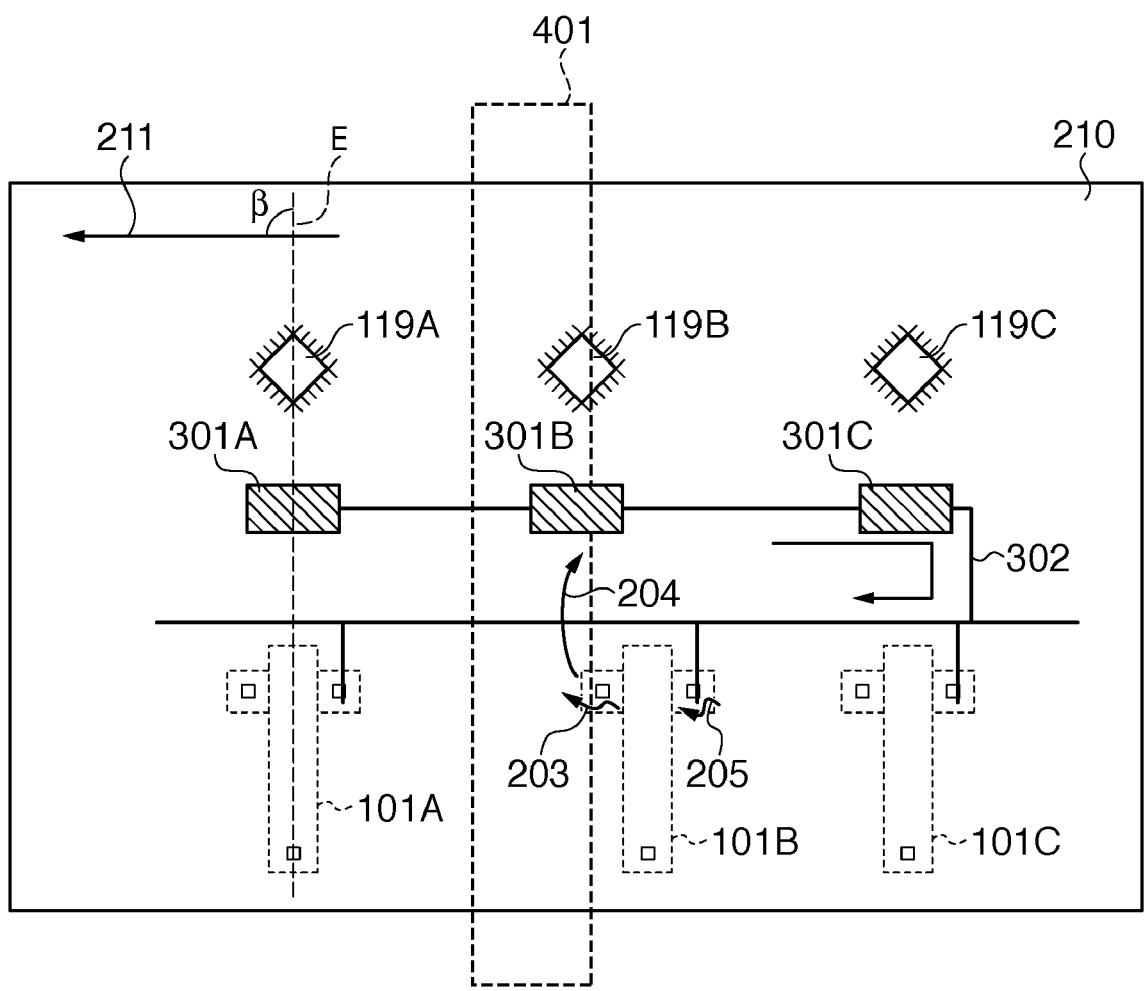
FIG. 1 is a circuit diagram illustrating an example of a board layout of a piezoelectric transformer type high-voltage power supply apparatus according to a first embodiment.

Now, embodiments of the present invention will be described. Individual embodiments described below will help understanding various concepts of the present invention such as superordinate, intermediate, and subordinate concepts. Also, the technical scope of the present invention is determined by the scope of the claims and is not limited by the following individual embodiments. Note that common parts in the drawings and the specification are denoted by the same reference numerals in order to simplify the description.

Related Technology

Figure 10:
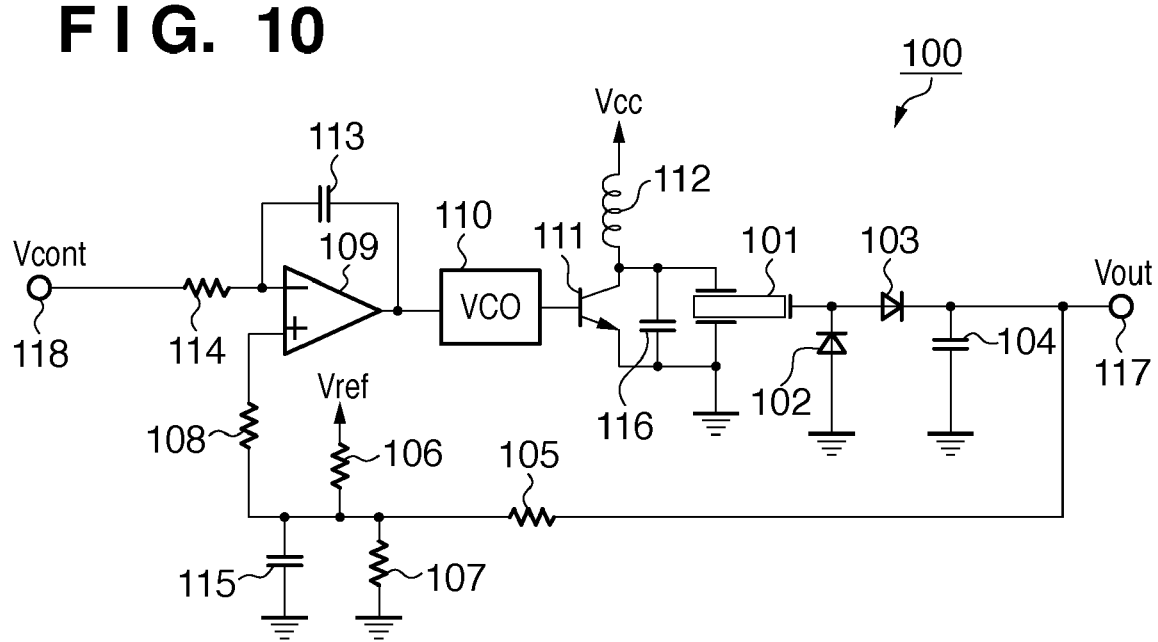
FIG. 10 is a circuit diagram of a piezoelectric transformer type high-voltage power supply apparatus for use in an image forming apparatus.

A high-voltage power supply apparatus 100 that outputs a positive voltage will be described as an example of an electronic apparatus with reference to FIG. 10. The high-voltage power supply apparatus 100 is, for example, used in an electrophotographic image forming apparatus and applies a high voltage to a transfer roller. The piezoelectric transformer 101 is adopted instead of a conventional wound-rotor type electromagnetic transformer. The output of the piezoelectric transformer 101 is rectified and smoothed into a positive voltage by a rectifier smoothing circuit. The rectifier smoothing circuit is constituted by rectifier diodes 102 and 103 and a high-voltage capacitor 104. The output voltage of the piezoelectric transformer 101 is output from an output terminal 117 that is connected to a path elongated from the piezoelectric transformer 101, and is supplied to a load (for example, a transfer roller (not shown)). Note that the output voltage is divided by resistors 105, 106, and 107 and is input into a capacitor 115 and into a non-inverting input terminal (positive terminal) of an operational amplifier 109 via a protective resistor 108.

On the other hand, an inverting input terminal (negative terminal) of the operational amplifier 109 receives an analog signal (a control signal (Vcont) of the high-voltage power supply apparatus) that has been input from an input terminal 118, via a resistor 114. The operational amplifier 109, the resistor 114, and a capacitor 113 serve as an integrating circuit. Specifically, the control signal Vcont that is smoothed according to an integration time constant determined by the constants of components of the resistor 114 and the capacitor 113 is input into the operational amplifier 109. The output terminal of the operational amplifier 109 is connected to a voltage controlled oscillator (VCO) 110. The voltage controlled oscillator 110 is an example of an oscillator that sets the frequency of its output signal variable according to the input control signal.

The output terminal of the voltage controlled oscillator 110 is connected to the gate of a field-effect transistor 111. The field-effect transistor 111 is an example of a switching element that is driven by the output signal of an oscillator. The drain of the field-effect transistor 111 is connected via an inductor 112 to a power supply Vcc (for example, +24 volts) and is grounded via a capacitor 116. The inductor 112 is an element that is connected between a switching element and a power supply and that is an example of an element having an inductance component to which a voltage is intermittently applied by drive of the switching element. The transistor drain is further connected to one of primary electrodes of the piezoelectric transformer 101. The other primary electrode of the piezoelectric transformer 101 is grounded. The source of the field-effect transistor 111 is also grounded.

The voltage controlled oscillator 110 performs switching of the field-effect transistor 111 at a frequency according to the output voltage of the operational amplifier 109. The inductor 112 and the capacitor 116 constitute a resonance circuit. The voltage amplified by this resonance circuit is supplied to the primary side of the piezoelectric transformer 101. As described above, the piezoelectric transformer 101 is connected to a connecting point between the switching element and the element having an inductance component, and upon application of a signal that oscillates at a specified resonance frequency, outputs a voltage according to the frequency characteristics of that signal.

As illustrated here, multiple semiconductor components including the field-effect transistor 111, the operational amplifier 109, and the voltage controlled oscillator (VCO) 110 are used to actuate the piezoelectric transformer 101. Also, the piezoelectric transformer type high-voltage power supply apparatus 100 used in an image forming apparatus or the like often has multiple high-voltage generation circuits formed on a single printed circuit board, so its wiring layout is very complicated in many cases.

A piezoelectric element used as the piezoelectric transformer 101 is manufactured by applying a strong DC electric field to a high-temperature sintered polycrystalline ferroelectric while applying heat at a temperature of several hundred degrees, and thereby aligning an electric dipole in the ferroelectric in a certain direction. Due to the nature of the ferroelectric, a dipole moment still remains after removal of the electric field, so the piezoelectric element has high piezoelectricity at ordinary temperatures.

Figure 11:
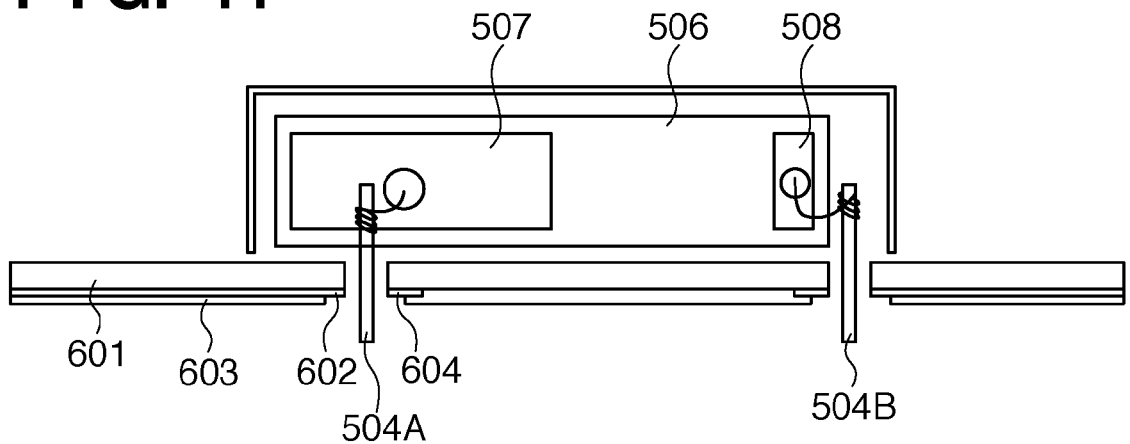
FIG. 11 illustrates the piezoelectric transformer 101 inserted into a printed circuit board.

FIG. 11 illustrates an example configuration of the piezoelectric transformer 101, which may be a piezoelectric element with any other configuration. A piezoelectric ceramic element 506 has a primary electrode 507 and a secondary electrode 508 evaporated thereon with a silver paste. The primary electrode 507 and the secondary electrode 508 are connected to a metallic primary terminal 504A and a metallic secondary terminal 504B, respectively, with gold filaments, and those connecting points are conducting via a solder. Now, a printed circuit board will be described using a commonly-used single-layer paper-phenolic board by way of example. The paper-phenolic board includes a copper foil 602 and a resist 603 as a wire on the surface of a paper-phenolic resin plate 601. A layer formed by the copper foil 602 and the resist 603 is referred to as a solder resist layer. The paper-phenolic board has holes formed at connecting portions between component terminals and the wiring portion. A solder land 604 for enabling soldering is formed around each hole. The solder land 604 is formed by stripping off the resist 603 by means of etching and thereby exposing the copper foil 602.

Figure 12A:
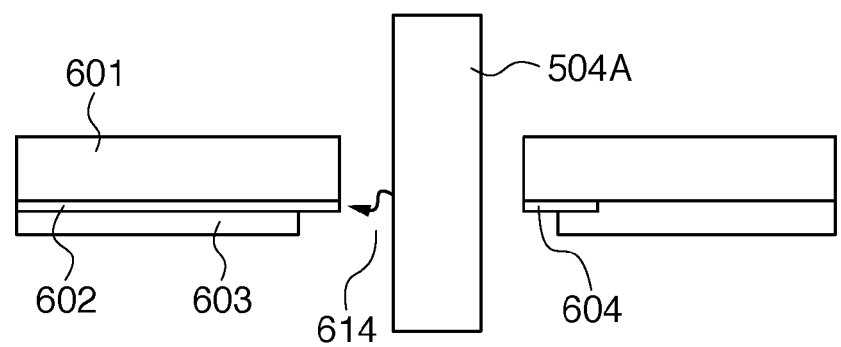
FIG. 12A is an enlarged view of the vicinity of a primary terminal 504A of the piezoelectric transformer 101 and a solder land 604 of a paper-phenolic board.
Figure 12B:
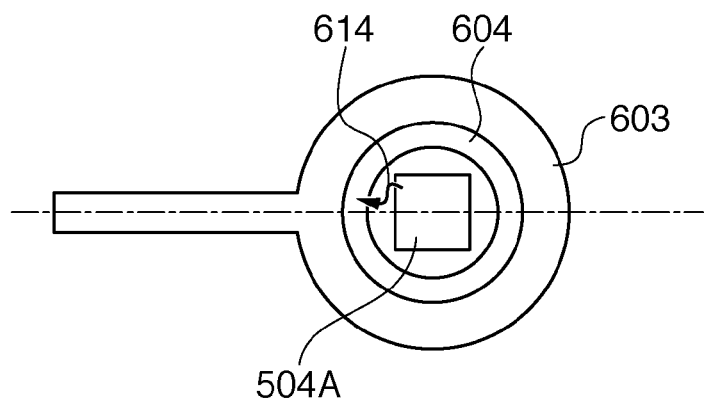
FIG. 12B is a diagram of a printed circuit board in FIG. 12A as viewed from the solder side.

FIGS. 12A and 12B illustrate the primary terminal 504A of the piezoelectric transformer 101. As described previously, when the printed circuit board with the piezoelectric transformer 101 is transported through a flow soldering bath, the piezoelectric ceramic element 506 is heated by a heater used in the course of preheating and by the heat of a solder jet flow in the flow soldering bath. Then, charge is generated due to a pyroelectric effect at the primary electrode 507 and the secondary electrode 508 of the heated piezoelectric ceramic element 506. That is, a voltage is generated at the primary terminal 504A and the secondary terminal 504B. The pyroelectric effect refers to an electric polarization phenomenon that occurs upon the heating or cooling of a crystal. While a pyroelectric material such as a piezoelectric element causes spontaneous polarization by a change in temperature, such polarization is neutralized without a change in temperature. The occurrence of such polarization causes an interior accumulated charge to be generated at electrodes attached across the element.

If there is a gap (hereinafter referred to as a "discharge gap") between the primary terminal 504A and the solder land 604, a high voltage generated due to the pyroelectric effect develops into a spark discharge 614 and is transmitted through the gap. Specifically, charge moves to the solder land 604 and the copper foil 602, which results in a dramatic fluctuation in the potential between the primary terminal 504A and the solder land 604.

Referring to FIG. 13, both a discharge characteristic 701 of the primary terminal 504A and a discharge characteristic 702 of the secondary terminal 504B tend to show a higher absolute value for the discharge voltage as the discharge gap increases. Note that the polarity of the discharge voltage varies depending on the polarity of the voltage applied during the polarization of the piezoelectric ceramic element 506. By way of example, the piezoelectric transformer 101 as used herein outputs a positive discharge voltage from the primary terminal 504A and a negative discharge voltage from the secondary terminal 504B.

Figure 14:
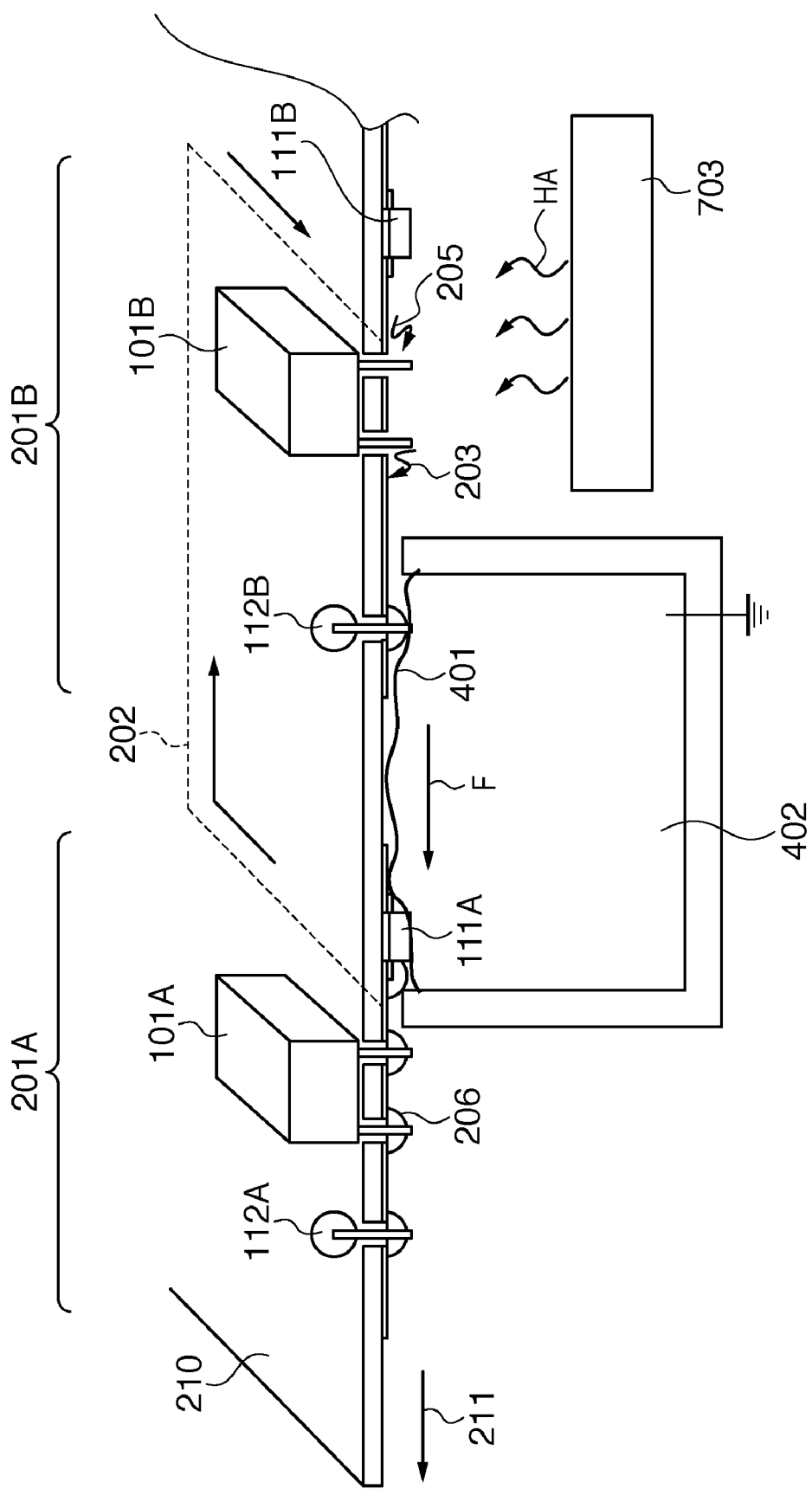
FIG. 14 is a diagram illustrating an undesirable effect of mounting associated with discharge generated due to the pyroelectric effect.

Referring to FIG. 14, on a printed circuit board 210, piezoelectric transformers 101A and 101B, field-effect transistors 111A and 111B as semiconductor components, and inductors 112A and 112B are mounted in advance in predetermined positions, using an automatic insertion machine or by manual insertion. In a flow soldering implementation process, the printed circuit board 210 is transported in a travelling direction indicated by arrow 211. The printed circuit board 210 is first preheated by a heater 703 and then transmitted through a solder jet flow 401 in a flow soldering bath 402. Thereby, soldering is accomplished.

Assume that a pattern that gives a reference potential to the piezoelectric transformers 101A and 101B and a pattern of source terminals of the field-effect transistors 111A and 111B are connected through a wire 202 on the printed circuit board 210, so that both of the patterns have a common potential.

The piezoelectric transformer 101A and the inductor 112A that belong to a circuit block 201A have already passed through the solder jet flow 401, so soldering 206 is completed. The field-effect transistor 111A that belongs to the circuit block 201A and the inductor 112B that belongs to the circuit block 201B are passing through the solder jet flow 401. Furthermore, the piezoelectric transformer 101B and the field-effect transistor 111B that belong to the circuit block 201B are in the course of preheating before passing through the solder jet flow.

If the piezoelectric transformer 101B in the course of preheating is rapidly heated by hot air HA from the heater 703, the pyroelectric effect causes a spark discharge 203 to be generated from the terminal of the not-yet-soldered piezoelectric transformer 101B to the land. The charge (discharge current) of the spark discharge 203 is transmitted to the terminal of of the inductor 112B that is passing through the solder jet flow 401 and to the land. The charge of the spark discharge 203 is further transmitted through the solder jet flow 401 along arrow F to the gate terminal of the field-effect transistor 111A that is passing through the solder jet flow 401. The charge that has passed through the field-effect transistor 111A is transmitted via the wire 202, develops into a spark discharge 205, and returns to the reference terminal of the piezoelectric transformer 101B. The above described is a travel path (discharge path) of the charge that comes out of the piezoelectric transformer 101B due to discharge. Upon generation of discharge, the potential at the gate terminal of the field-effect transistor 111A rises rapidly relative to the source terminal thereof that is connected to the reference potential of the printed circuit board 210. Thus, if this potential exceeds an electrostatic withstand voltage of the gate terminal, the piezoelectric transformer 101B will be broken in excess of the electrostatic withstand voltage.

Referring now to FIG. 15, on another printed circuit board 210, a piezoelectric transformer 101, a semiconductor component 119, and a rectifier diode 103 that is connected via a wire to a secondary land of the piezoelectric transformer 101 are mounted in advance, using an automatic insertion machine or by manual insertion. The semiconductor component 119 is, for example, a VCO circuit, an operational amplifier, or an IC obtained by combining those components. In a flow soldering bath 402, soldering is accomplished by transporting the board in a board travelling direction (the direction indicated by arrow 211) for passage through the solder jet flow 401. In the state illustrated in FIG. 15, the piezoelectric transformer 101 is in the course of preheating and has not yet reached the solder jet flow 401. A pattern that gives a reference potential to the piezoelectric transformer 101 and a pattern that gives a reference potential to the semiconductor component 119 are connected via a wire 202 on the printed circuit board 210, so that both of the patterns have a common potential.

If the piezoelectric transformer 101 in the course of preheating is rapidly heated by a heater or by the heat of the solder jet flow 401, the pyroelectric effect causes the spark discharge 203 to be generated from the secondary terminal of the not-yet-soldered piezoelectric transformer 101 to the land. The charge of the spark discharge 203 is transmitted to the terminal of the rectifier diode 103 that is passing through the solder jet flow 401 and to the land. The charge is further transmitted through the solder jet flow 401 as indicated by arrow F to the terminal of the semiconductor component 119 that is passing through the solder jet flow 401. The charge that has passed through the semiconductor component 119 develops into a spark discharge 205 via the wire 202. The spark discharge 205 returns to a primary reference terminal of the piezoelectric transformer 101.

A travel path of the charge that comes out of the piezoelectric transformer 101 due to discharge is also described using the model as described above. Also in this discharge process, the potential at the terminal of the semiconductor component 119 rises rapidly relative to the reference potential thereof. Thus, if this potential exceeds the electrostatic withstand voltage of the terminal, the semiconductor component 119 will be broken.

As described with reference to FIGS. 14 and 15, the solder jet flow 401 in the flow soldering bath is disposed perpendicular to the travelling direction (the direction indicated by arrow 211) of the printed circuit board 210. Thus, even if a solder land for a terminal of the piezoelectric transformer 101 and a semiconductor component are not in direct contact through a pattern, they may possibly be brought into connection through the solder jet flow 401. Moreover, since the flow soldering bath is generally grounded to the earth, the solder jet flow 401 is also considered as being grounded to the earth from a broad view. However, the reference potential of the printed circuit board 210 that is passing through the flow soldering bath 402 is in a floating state unless the board is directly grounded to the earth or brought into contact with the flow soldering bath 402. Therefore, if discharge is generated due to the pyroelectric effect from the piezoelectric transformer 101, the discharge current will flow through a lower impedance pattern or a lower impedance component terminal because a discharge destination pattern or potential is in a floating state relative to the earth.

The following two methods, for example, are conceivable as a method for restraining breakage of the semiconductor component 119 due to discharge caused by the pyroelectric effect. The first method is to first solder components other than the piezoelectric transformer 101 and then manually solder the piezoelectric transformer 101 afterwards. The second method is to establish a short circuit across terminals (electrodes) of the piezoelectric transformer 101 using a conductive member during solder mounting, thereby creating a contact discharge path.

The former method has the disadvantage of increased mounting cost because of the needs of manpower and time, particularly in the case of such a large-scale high-voltage power supply apparatus that has multiple piezoelectric transformers 101 mounted on a single printed circuit board 210. The latter method has the advantage of not requiring manpower. The latter method may be implemented if there is a conductive member that has excellent heat resistance and excellent durability in order to repeatedly establish a short circuit across the terminals of the piezoelectric transformer 101 in a high-temperature environment. However, if such a conductive member falls off during mounting or causes a contact failure, the semiconductor component 119 may not be adequately protected from discharge. Thus, the latter method is not sufficient. In view of the above, embodiments described below propose methods for manufacturing an electronic apparatus that enables a semiconductor component to be protected from discharge with use of a low-cost and simple method.

FIRST EMBODIMENT

The present invention is applicable to any electronic apparatus that includes a printed circuit board with a piezoelectric element and a semiconductor component, and the electronic apparatus does not need to be a high-voltage power supply apparatus. The present invention is also effective for a high-voltage power supply apparatus that outputs either a positive or negative voltage. Here, a high-voltage power supply apparatus that outputs a positive voltage will be described by way of example.

Piezoelectric transformers 101A, 101B, and 101C and semiconductor components 119A, 119B, and 119C illustrated in FIG. 1 are circuit components for forming different circuit blocks. This does not mean that the piezoelectric transformer 101A and the semiconductor component 119A, for example, constitute the same circuit block. In the present embodiment, the piezoelectric transformers 101A, 101B, and 101C and the semiconductor components 119A, 119B, and 119C are located parallel to a travelling direction (the direction indicated by arrow 211) of a printed circuit board 210 during a solder mounting process. Specifically, the semiconductor component 119A and the piezoelectric transformer 101A are located on the printed circuit board 210 so that a straight line E that connects the semiconductor component 119A and the piezoelectric transformer 101A is approximately orthogonal to the travelling direction of the printed circuit board 210 during a soldering process. In other words, the travelling direction and the straight line E form an angle β of approximately 90 degrees. The same applies to the semiconductor component 119B and the piezoelectric transformer 101B. And, the same also applies to the semiconductor component 119C and the piezoelectric transformer 101C.

Moreover, a reference potential pattern 302 for giving a reference potential to the piezoelectric transformers 101A, 101B, and 101C is located between the piezoelectric transformers 101A, 101B, and 101C and the semiconductor component 119A, 119B, and 119C. A resist of the reference potential pattern 302 is partly stripped off so as to expose some wiring portions, and the exposed wiring portions form solder lands 301A, 301B, and 301C. The solder lands 301A, 301B, and 301C are located so as to suppress charge on the terminals of the piezoelectric transformers 101A, 101B, and 101C from travelling to the semiconductor components 119A, 119B, and 119C during passage through a solder jet flow 401 in a flow soldering bath. Assume that the reference potential pattern 302 for the piezoelectric transformers is connected to a ground line.

The spark discharge 203 generated from the terminal of the piezoelectric transformer 101B, for example, passes into the solder land 301B connected to the reference potential pattern 302 for the piezoelectric transformer 101B through the solder jet flow 401 in the flow soldering bath. Thereafter, the charge resulting from the spark discharge 203 comes back as a spark discharge 205 to the reference terminal of the piezoelectric transformer 101B. In this way, the discharge path of the discharge current is formed by the piezoelectric transformer 101B, the solder jet flow 401, the solder land 301B, and the reference potential pattern 302. In particular, the provision of the solder land 301B between the semiconductor component 119B and the piezoelectric transformer 101B suppresses passage of the discharge current to the semiconductor component 119B.

Figure 2A:
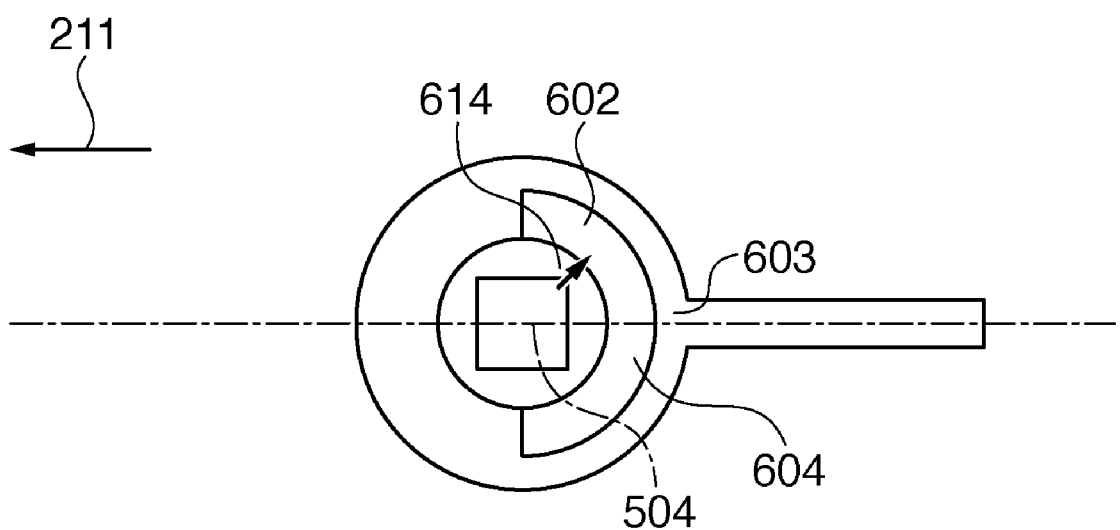
FIG. 2A is a plan view illustrating the shape of a land relating to a terminal of a piezoelectric transformer.
Figure 2B:
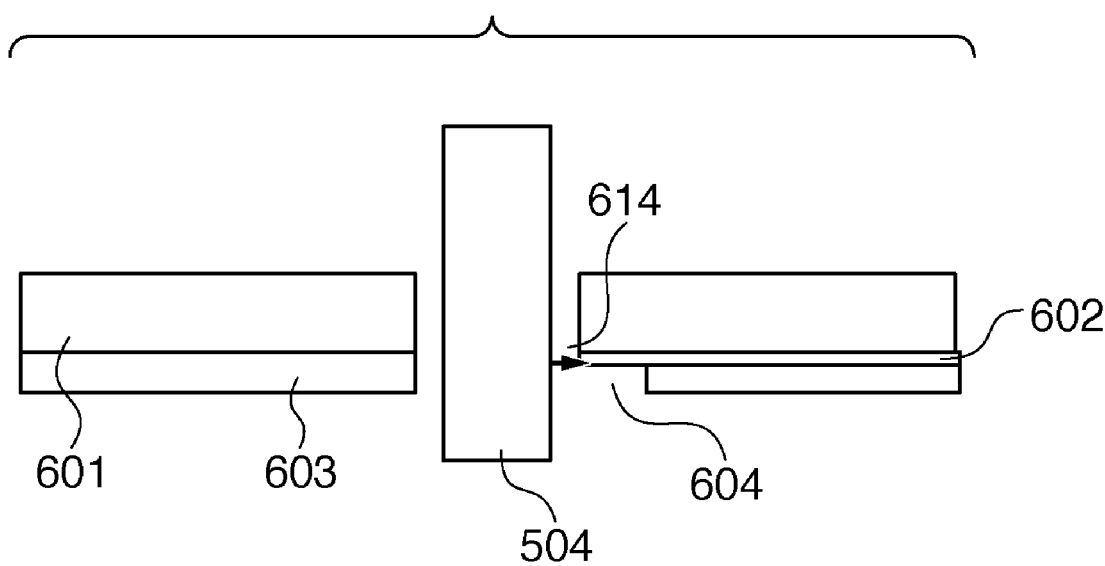
FIG. 2B is a vertical cross-sectional view illustrating the shape of a land relating to a terminal of a piezoelectric transformer.

Moreover, as for the land shape of sites where components are connected to the printed circuit board 210, the adoption of a land shape illustrated in FIGS. 2A and 2B enables control of the direction of discharge from a terminal 504. For example, if a solder land 604 is formed by stripping off the right half of a doughnut-shaped resist 603 and thereby exposing a copper foil 602 of a wiring portion, a discharge path is formed in a location where the terminal 504 is closest to the solder land 604. If the solder land 604 is located behind the terminal 504 in the travelling direction of the printed circuit board 210 (the direction indicated by arrow 211), the timing of soldering of a discharge destination may be delayed to later than the timing of discharge.

As described above, a solder land that is connected to a reference potential pattern is provided between a semiconductor component and a piezoelectric element so that a discharge current generated at the piezoelectric element due to the pyroelectric effect is restrained from flowing into the semiconductor component during the soldering process using a solder jet flow. In other words, a discharge path is formed by the piezoelectric element, the land, the reference potential pattern, and the solder jet flow. It is thus possible to relieve the discharge current generated at the piezoelectric element due to the pyroelectric effect to the discharge path during the soldering process using the solder jet flow. This enables a semiconductor component to be protected from discharge with a low-cost and simple method. This further decreases the probability of failure of a semiconductor component, thus improving the yield of an electronic apparatus such as a high-voltage power supply apparatus.

The reference potential pattern 302 may be a ground pattern for a piezoelectric transformer or a semiconductor component that are located over a wide range on the printed circuit board 210, or may be a power supply voltage pattern for a semiconductor component. In this case, the reference potential pattern 302 that forms part of the discharge path may be implemented in a relatively simple pattern design.

While the present embodiment has been described using a model that generates discharge from a primary terminal of a piezoelectric transformer, the present invention is also effective for discharge generated from a secondary terminal of a piezoelectric transformer. This applies to other embodiments described below. The present embodiment has been described using the model in which the three piezoelectric transformers and the three semiconductor components are mounted on the printed circuit board 210. However, a similar effect to that in the present embodiment is also attained with a printed circuit board that includes at least one piezoelectric transformer and at least one semiconductor component.

SECOND EMBODIMENT

In the first embodiment, the semiconductor components are protected from discharge by providing the solder lands 301A, 301B, and 301C between the semiconductor components and the piezoelectric elements. In a second embodiment, a soldering enabling pattern is adopted instead of the solder lands 301A, 301B, and 301C.

Figure 3:
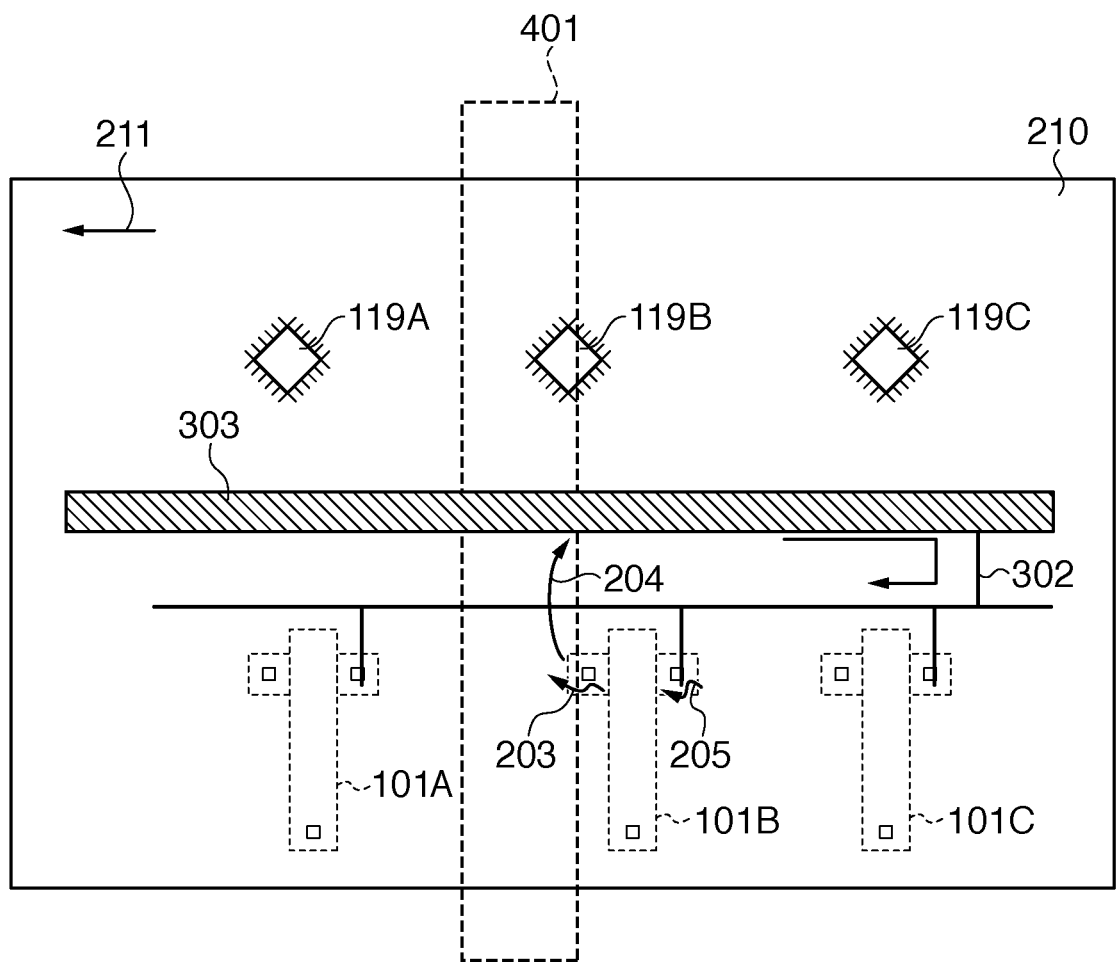
FIG. 3 is a circuit diagram illustrating an example of a board layout of a piezoelectric transformer type high-voltage power supply apparatus.

A soldering enabling pattern 303 illustrated in FIG. 3 is a kind of land formed by exposing a wiring portion of a reference potential pattern 302. A single or multiple soldering enabling patterns 303 are located generally in parallel with a board travelling direction (the direction indicated by arrow 211) during solder mounting. That is, the soldering enabling pattern 303 that is part of a reference potential pattern and that extends in the travelling direction of a printed circuit board during the soldering process is adopted as a land that forms part of a discharge path. To simplify the description, FIG. 3 illustrates a single soldering enabling pattern 303. Note that the reference potential pattern 302 may be a pattern that gives a reference potential to a piezoelectric transformer 101B or may be a pattern that gives a reference potential to a semiconductor component 119B.

With such provision of the soldering enabling pattern 303 connected to a reference potential pattern between a semiconductor component and a piezoelectric element, a discharge path is formed by the piezoelectric element, the soldering enabling pattern 303, the reference potential pattern 302, and a solder jet flow 401. Thus, the second embodiment also attains a similar effect to that in the first embodiment. Moreover, in the second embodiment, the soldering enabling pattern 303 that extends over a predetermined area makes more stable contact with discontinuous irregularities in the solder jet flow 401 than in the first embodiment. Thus, it may be said that the second embodiment improves the reliability of protection of a semiconductor component.

THIRD EMBODIMENT

Figure 4:
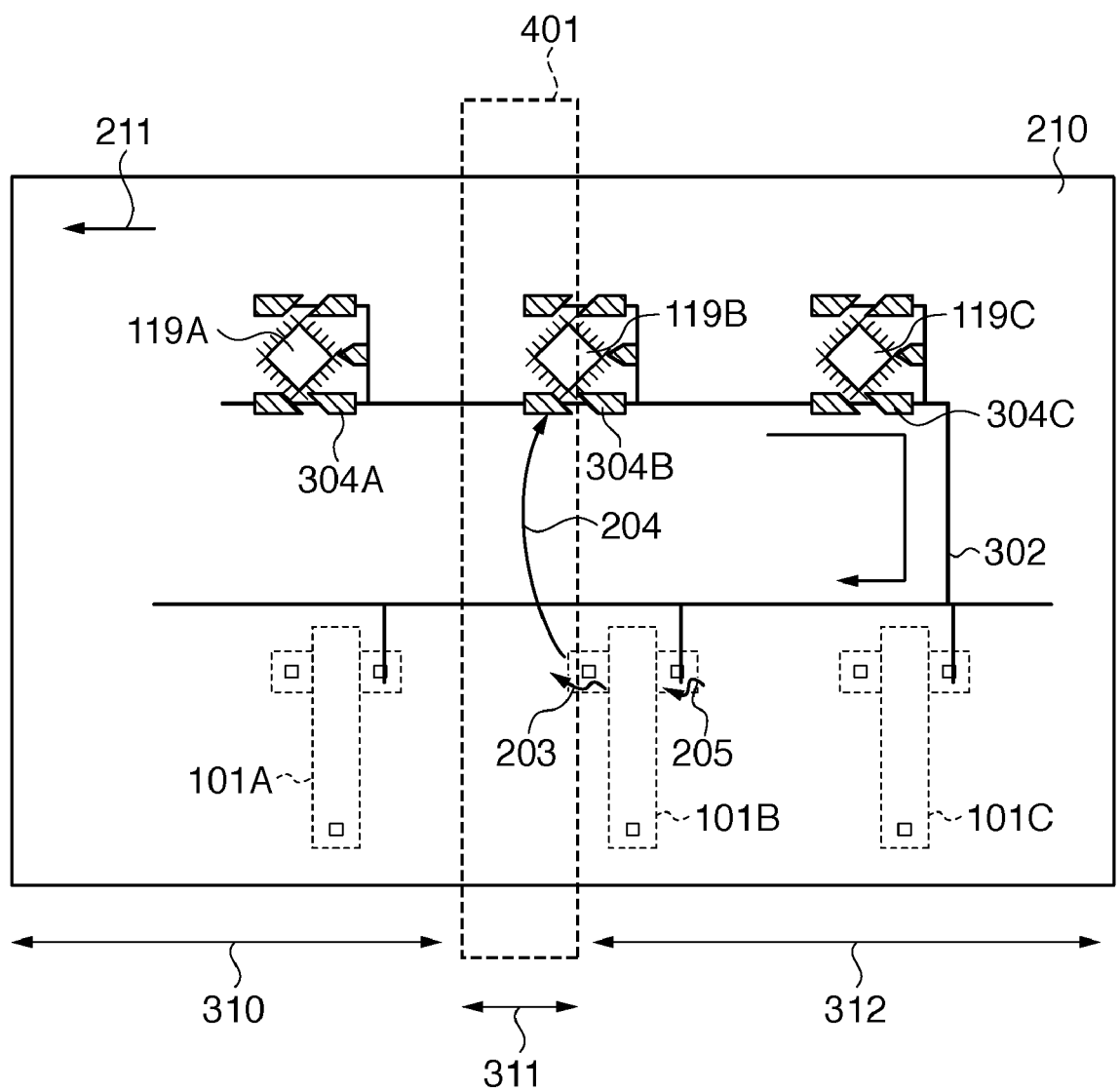
FIG. 4 is a circuit diagram illustrating an example of a board layout of a piezoelectric transformer type high-voltage power supply apparatus.

A major difference of a third embodiment illustrated in FIG. 4 from the first and second embodiments is that anti-solder bridging patterns 304A, 304B, and 304C that are provided at end portions of semiconductor components are adopted as a discharge path in order to restrain the occurrence of solder bridging during the soldering process. Note that the anti-solder bridging patterns 304A, 304B, and 304C may also be referred to as dummy lands or dummy pads. The anti-solder bridging patterns 304A, 304B, and 304C are connected to ground lines or power supply lines through which a reference potential is given to semiconductor components. Note that the anti-solder bridging patterns 304A, 304B, and 304C are formed by stripping off a resist 603 and thereby exposing a copper foil 602 of wiring portions.

As described above, the anti-solder bridging patterns 304A, 304B, and 304C connected to a reference potential pattern are provided between the semiconductor components and the piezoelectric elements. Accordingly, a discharge path is formed by the piezoelectric elements, the anti-solder bridging patterns 304A, 304B, and 304C, the reference potential pattern 302, and a solder jet flow 401.

The third embodiment thus attains similar effects to those in the first and second embodiments. The third embodiment may further attain a higher protection effect if the anti-solder bridging patterns 304A, 304B, and 304C are shaped so as to surround semiconductor components to be protected. Of course, the anti-solder bridging patterns 304A, 304B, and 304C of the third embodiment may be combined with the first or second embodiment. In such a case, an even higher protection effect will be attained.

Moreover, in some cases such as the case of a compact printed circuit board, it may be difficult in terms of layout to locate a land or a pattern as described in the first or second embodiment. The anti-solder bridging patterns 304A, 304B, and 304C according to the third embodiment are advantageous in this respect, since they may be formed on a compact printed circuit board or the like.

FOURTH EMBODIMENT

While the present invention is effective for any high-voltage power supply apparatus that outputs either a positive or negative voltage, the present embodiment is described using a high-voltage power supply apparatus that outputs a positive voltage by way of example. The description is based on the assumption that the terminal at which a voltage is generated due to the pyroelectric effect is a secondary terminal, and the generated voltage has a negative polarity.

Figure 5:
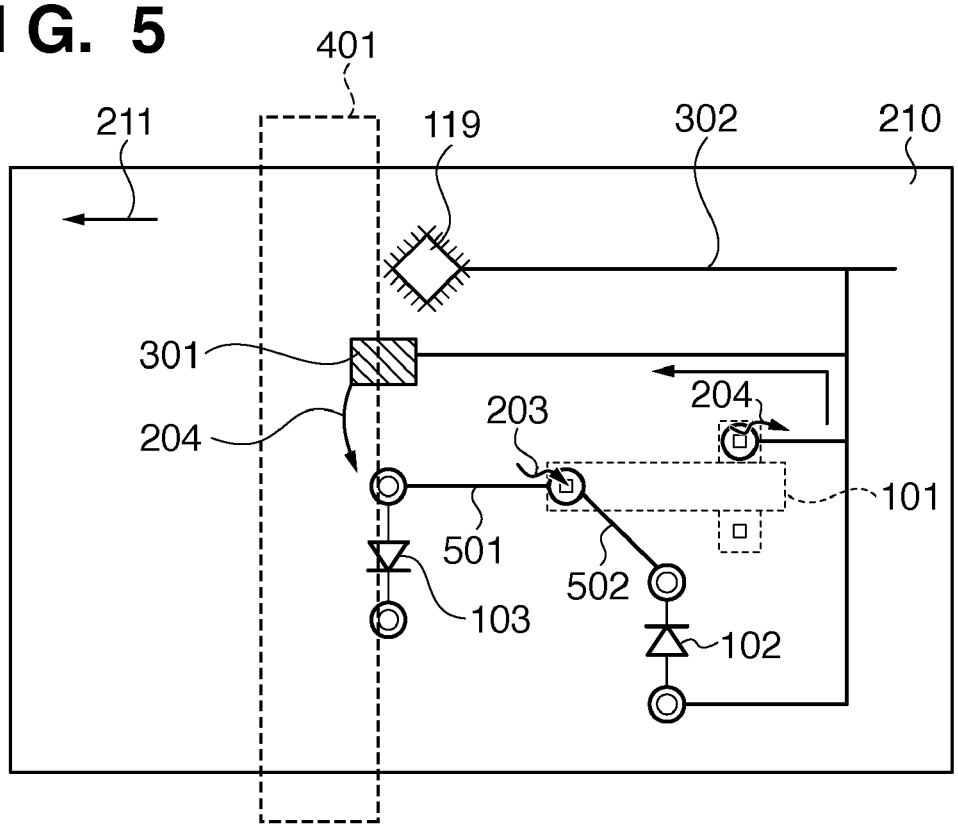
FIG. 5 is a circuit diagram illustrating an example of a board layout of a piezoelectric transformer type high-voltage power supply apparatus according to a fourth embodiment.

In a fourth embodiment illustrated in FIG. 5, a semiconductor component 119 is located in front of a piezoelectric transformer 101 in a travelling direction of a printed circuit board 210 (the direction indicated by arrow 211) during the soldering process. In addition, an elongating pattern 501 is wired that is elongated from a terminal land of the piezoelectric transformer 101 forward in the travelling direction to a terminal of a rectifier diode 103, for example. Note that the terminal land of the piezoelectric transformer 101 and one end of a diode 102 are connected via an elongating pattern 502 that is elongated from the terminal land of the piezoelectric transformer 101 in generally an opposite direction from the travelling direction. The other end of the diode 102 is connected to a reference potential pattern 302. In the fourth embodiment, the reference potential pattern 302 for giving a reference potential to the piezoelectric transformer 101 or the semiconductor component 119 is located between the piezoelectric transformer 101 and the semiconductor component 119. Moreover, a solder land 301 is formed by partly stripping off the resist of the reference potential pattern 302 and thereby exposing a wiring portion.

A spark discharge 203 generated due to the pyroelectric effect of the piezoelectric transformer 101 (the discharge current that has a negative polarity in the present example flows in a direction toward the piezoelectric transformer 101) passes into the reference potential pattern 302 through the elongating pattern 501 and a solder jet flow 401. The charge resulting from the spark discharge 203 develops into a spark discharge 204 and comes back to another terminal of the piezoelectric transformer 101. In this way, a discharge path is formed by the piezoelectric transformer 101, the elongating pattern 501, the solder land 301, the reference potential pattern 302, and the solder jet flow 401. Accordingly, the discharge current does not flow into the semiconductor component 119. The reference potential pattern 302 that gives a reference potential to the piezoelectric transformer 101 may be a ground line or a power supply line. As described above, the elongating pattern 501 that is elongated from the terminal land of the piezoelectric transformer 101 to a connected component is located parallel to the semiconductor component 119 in the travelling direction of the printed circuit board 210. In addition, the reference potential pattern 302 is located between the elongate pattern 501 and the semiconductor component 119. This enables the semiconductor component 119 to be protected from the discharge of the piezoelectric transformer 101. That is, the fourth embodiment attains similar effects to those in the first and second embodiments.

While the present embodiment has been described using a model that generates discharge from a secondary terminal of the piezoelectric transformer 101, the present embodiment is also effective for discharge from a primary terminal of the piezoelectric transformer 101. Also, while the description was based on a model that generates negative discharge, the present embodiment is also applicable to a model that generates positive discharge.

FIFTH EMBODIMENT

Figure 6:
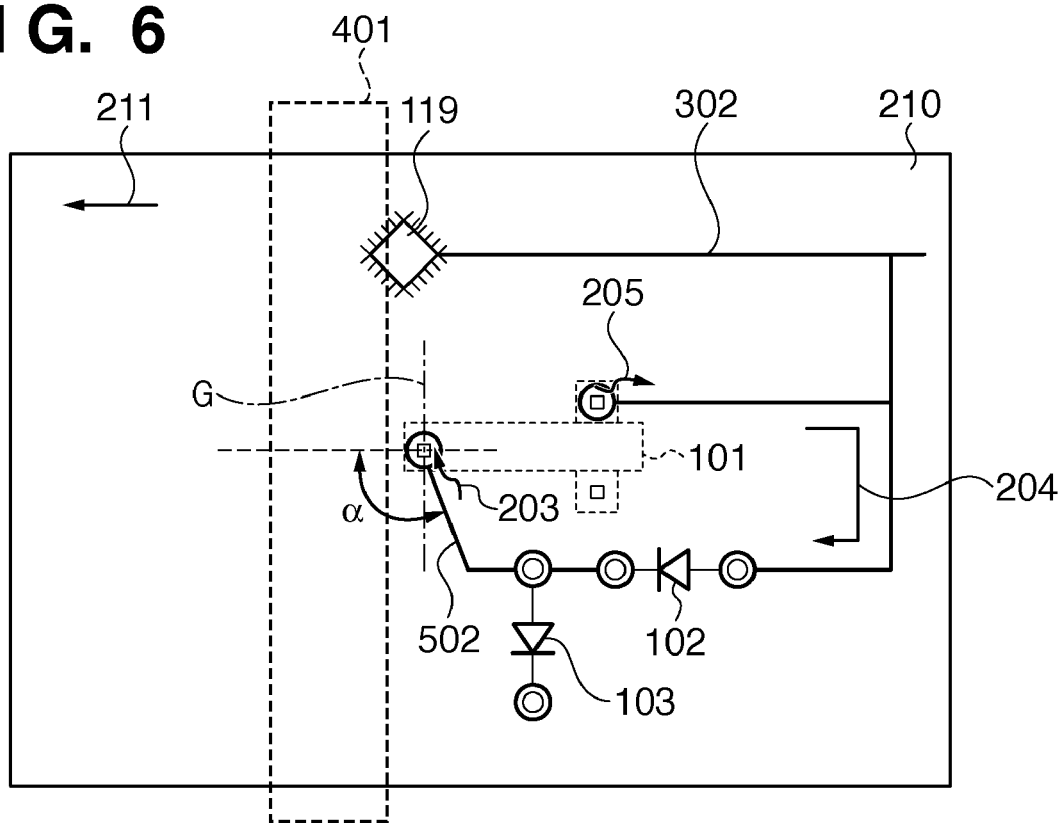
FIG. 6 is a circuit diagram illustrating an example of a board layout of a piezoelectric transformer type high-voltage power supply apparatus.

In a fifth embodiment illustrated in FIG. 6, points that overlap with those of the fourth embodiment will not be described. A feature of the fifth embodiment is that an elongation direction of an elongating pattern 502 that extends from a terminal land of a piezoelectric transformer 101 to rectifier diodes 102 and 103, for example, forms an angle $\alpha$ of more than 90 degrees ($\alpha > 90°$) with the travelling direction (the direction indicated by arrow 211). The elongating pattern 502 is located at the rear of a broken line G that is orthogonal to the travelling direction and that passes through the terminal land of the piezoelectric transformer 101.

A reference potential pattern 302 that gives a reference potential (a ground potential in the present example) to the piezoelectric transformer 101 and a pattern for a ground terminal of a semiconductor component 119 are connected through a wiring portion of a printed circuit board 210, so that both of the patterns have a common potential. Assume in FIG. 6 that the piezoelectric transformer 101 is immediately before reaching a solder jet flow 401 or in the course of preheating. Also assume that the semiconductor component 119 is passing through the solder jet flow 401.

If the piezoelectric transformer 101 that is immediately before reaching the solder jet flow 401 or in the course of preheating is rapidly heated by a heater (not shown) or by the heat of the solder jet flow 401, the pyroelectric effect causes a spark discharge 203 to be generated from a secondary terminal to the land. Since the spark discharge 203 has a negative polarity, the discharge current flows in a direction toward the piezoelectric transformer 101. This discharge current flows through the reference potential pattern 302 for the piezoelectric transformer 101 via a yet-to-be-soldered rectifier diode 102 and comes back to a primary terminal of the piezoelectric transformer 101. At that time, a spark discharge 205 is generated at the primary terminal of the piezoelectric transformer 101. That is, a discharge path is formed by the secondary terminal of the piezoelectric transformer 101, the elongating pattern 502, the rectifier diode 102, the reference potential pattern 302, and the primary terminal of the piezoelectric transformer 101. Accordingly, the discharge current does not flow into the semiconductor component 119.

As described above, the circuit configuration of the fifth embodiment also attains a similar effect to that in the first embodiment. In particular, the elongating pattern 502 that is elongated from the terminal land of the piezoelectric transformer 101 is wired in such a direction as to form an angle of more than 90 degrees with the travelling direction. This suppresses the passage of discharge current into the semiconductor component 119 through the solder jet flow 401. On a printed circuit board where multiple piezoelectric transformers and multiple semiconductor components are located in a complicated manner, the fifth embodiment is particularly effective for a terminal land of a piezoelectric transformer that is located closest to the tip of the printed circuit board in a travelling direction, and for an elongating pattern elongated therefrom. In other words, the protection effect is enhanced by adopting, as a land that forms part of a discharge path, the elongating pattern 502 that is elongated backward from one of multiple terminals of piezoelectric elements that is located closest to the tip of the printed circuit board in the travelling direction. Note that the elongating pattern 502 is a pattern that brings a piezoelectric element and either a rectifier element or a driving element into conduction. In the case where a rectifier element or a driving element is connected at one end to the elongating pattern 502 and connected at the other end to the reference potential pattern 302, the rectifier element or the driving element also forms part of a discharge path. Since the rectifier element or the driving element has a higher electrostatic withstand voltage than the semiconductor component 119, there is no problem if the element forms part of the discharge path. Note that the protection effect may be further enhanced by combining the fifth embodiment with any one of the first to fourth embodiments.

SIXTH EMBODIMENT

A feature of the present embodiment is that the shape and size of a terminal of a piezoelectric element are determined relative to a hole that is provided for insertion of a terminal in a printed circuit board, so that the side face of the terminal and the outer wall of the hole are brought into conduction or into intimate contact with each other.

As illustrated in FIGS. 12 and 11, if there is a gap (space) between the terminal 504A or 504B of the piezoelectric transformer 101 and the solder land 604 (in other words, if the terminal and the solder land are not in intimate contact with each other), a high voltage generated due to the pyroelectric effect is transmitted as a spark discharge over the gap. The discharge current associated with an aerial discharge or a spark discharge has a smaller time constant than the discharge current resulting from ordinary contact discharge, so charge travels with extremely short pulses. It is thus highly difficult to provide protection with a terminal protective diode provided at a terminal of the semiconductor component 119 or with a terminal capacitance. Also, in the case of aerial discharge, the discharge voltage also varies depending on the length of a gap. A shorter gap reduces the level of voltage that passes into a discharge destination and accordingly increases a margin for the electrostatic withstand voltage. If the protection methods that have been described in the first to fifth embodiments are employed while either restraining the generation of aerial discharge so as to generate only contact discharge or narrowing a gap between a terminal and a land so as to reduce the discharge voltage, the quality of protection will be improved greatly.

Figure 7A:
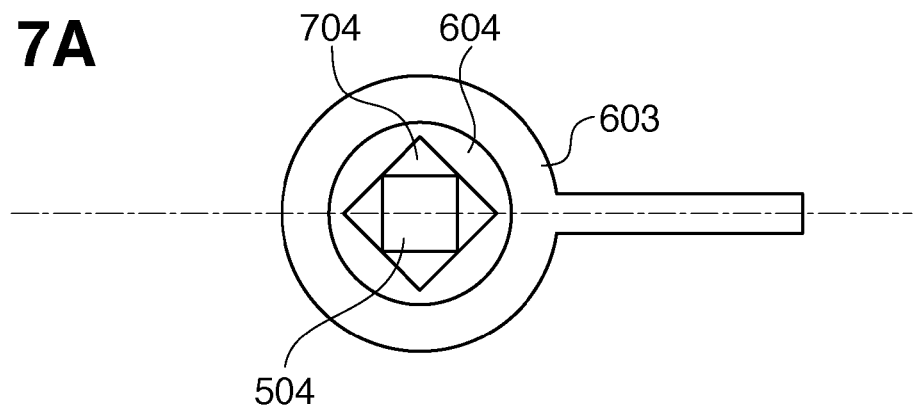
FIGS. 7A, 8A, and 9A are enlarged views of the vicinity of a portion where a terminal of a piezoelectric transformer 101 is inserted through a solder land 604 of a paper-phenolic resin plate 601.
Figure 7B:
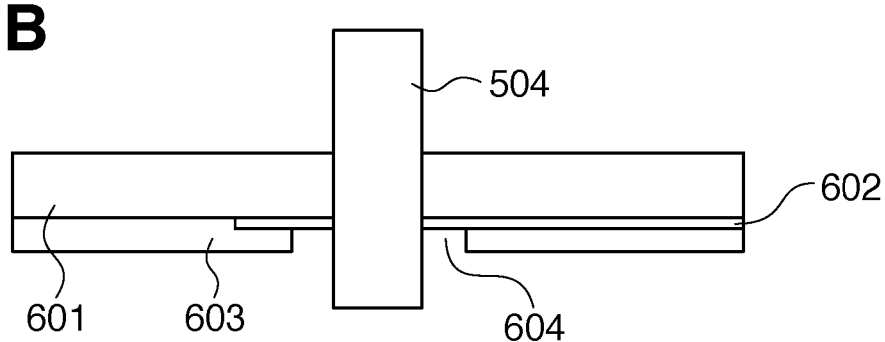
FIGS. 7B, 8B, 9B are vertical cross-sectional views of the vicinity of a portion where the terminal of the piezoelectric transformer 101 is inserted through the solder land 604 of the paper-phenolic resin plate 601.

A feature of the configuration of a terminal land portion illustrated in FIGS. 7A and 7B is that a terminal 504 has a square shape in horizontal section, a terminal insertion hole 704 also has a square shape in horizontal section, and the outer wall of the terminal insertion hole 704 and the side face of the terminal 504 form an angle, in other words, they are not parallel to each other. Referring to FIG. 7A, the outer wall of the terminal insertion hole 704 and the side face of the terminal 504 form an angle of 90 degrees. This is in order to bring an edge portion of the terminal 504 into intimate contact or contact with the outer wall of the terminal insertion hole 704.

Moreover, such intimate contact or contact may be improved by devising the shapes and sizes of the terminal insertion hole 704 and the terminal 504. For example, the length of the longest line segment of the terminal 504 in horizontal section may be made longer than the length of the shortest line segment of the terminal insertion hole 704 in horizontal section before the terminal 504 is inserted into the terminal insertion hole 704. With those shapes and sizes, the terminal 504 is inserted into the terminal insertion hole 704 while scratching the outer wall of the terminal insertion hole 704 with its edge portion. This is one technique for bringing the edge portion of the terminal 504 into intimate contact or contact with the outer wall of the terminal insertion hole 704. In this way, the gap between the edge of an exposed portion (solder land 604) of the copper foil 602 and the terminal 504 can be eliminated or shortened.

Figure 8A:
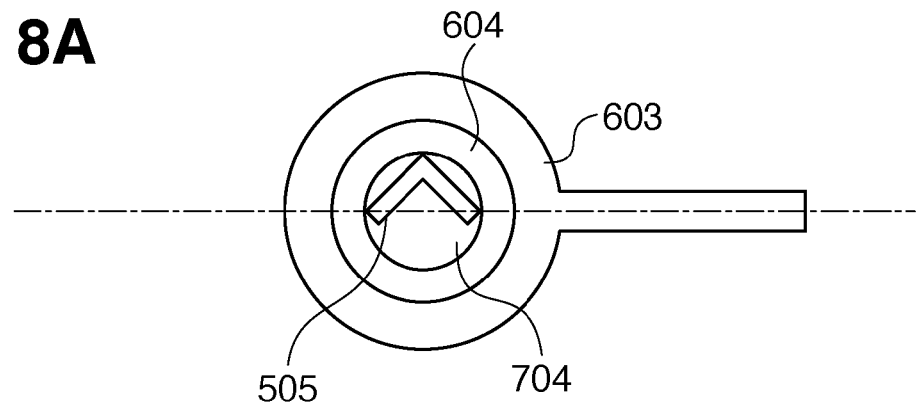
Figure 8B:
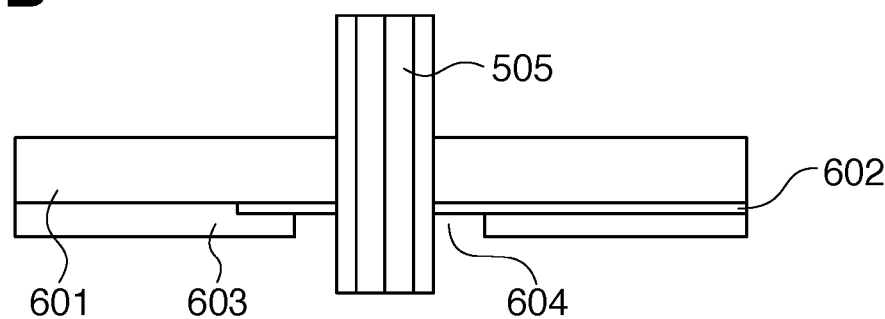

As illustrated in FIGS. 8A and 8B, an L-shaped terminal 505 in horizontal section is adopted instead of the rectangular terminal 504. The horizontal direction as referred to herein is a direction that is parallel to the surface of a printed circuit board 210. Such an L-shaped configuration in cross section allows the terminal 505 to be somewhat elastic in its lateral direction. Also, with the terminal 505 inserted into the terminal insertion hole 704, the terminal 505 elastically butts against the outer wall of the terminal insertion hole 704. Thus, a gap between the end of an exposed portion of the copper foil 602 and the side face of the terminal 505 may be either eliminated or shortened. In particular, such an effect of shortening a gap is further enhanced with use of a metal such as a high-elastic stainless steel or phosphor bronze as a material for the terminal 505.

Figure 9A:
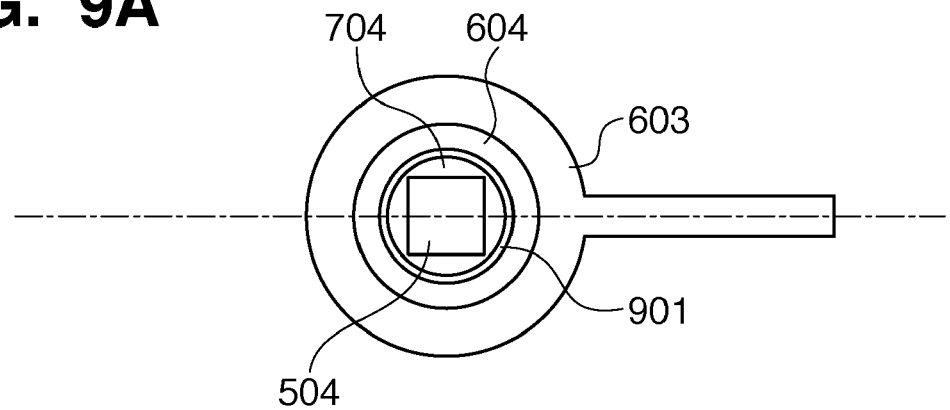
Figure 9B:
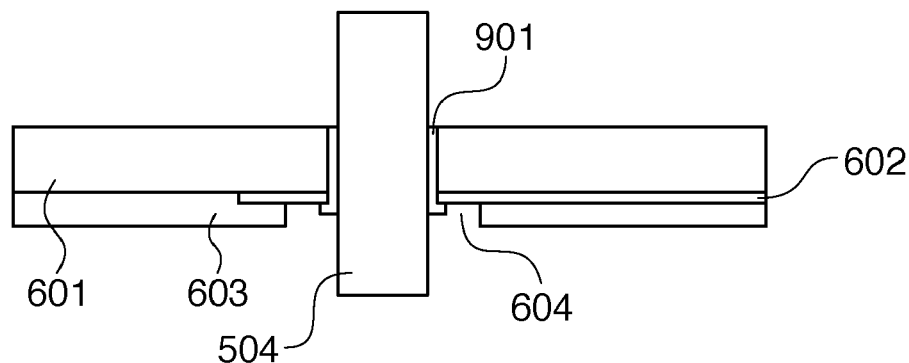

A feature of a terminal land portion illustrated in FIGS. 9A and 9B is that a conductive member 901 for conduction between a terminal 504 and a terminal insertion hole 704 is provided between the terminal 504 and the terminal insertion hole 704. The conductive member 901 is a metal, a conductive rubber, or a conductive adhesive, for example, that is provided on the wall surface of the terminal insertion hole 704. The conductive member 901 brings the terminal 504, the land 604, and the copper foil 602 into conduction, thus eliminating or shortening a gap.

As described above, in the sixth embodiment, a discharge gap between a terminal and the solder land 604 may be eliminated or shortened by devising the shapes and sizes of the terminals 504 and 505 and the terminal insertion hole 704 or by adding the conductive member 901. This results in a reduction in the voltage applied to a discharge destination, thus enhancing the effect of protecting the semiconductor component 119. Of course, a higher protection effect will be attained if the sixth embodiment is combined with one or more of the first to fifth embodiments.

OTHER EMBODIMENTS

Finally, a method for manufacturing an electronic apparatus will be described. First, a land that is connected to a reference potential pattern 302 is formed between a semiconductor component 119 and a piezoelectric transformer 101 by exposing a wiring portion of a solder resist layer on a printed circuit board 210. Then, the semiconductor component 119 and the piezoelectric transformer 101 are mounted on the printed circuit board 210. Moreover, the printed circuit board 210 with the semiconductor component 119 and the piezoelectric transformer 101 is brought into contact with a solder jet flow 401 while moving the printed circuit board 210 in a predetermined direction (the direction indicated by arrow 211). A discharge current generated at the piezoelectric transformer 101 due to the pyroelectric effect flows through a discharge path formed by the piezoelectric transformer 101, the land, and the reference potential pattern 302. Accordingly, little discharge current flows into the semiconductor component 119. Note that the solder jet flow 401 may be included in the discharge path.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-119073, filed May 15, 2009 which is hereby incorporated by reference herein in its entirety.

What is claimed is:

1. An electronic apparatus comprising:
a circuit board with an electronic component and a piezoelectric element, the circuit board being transported so as to solder the electronic component and the piezoelectric element to the circuit board;
a reference potential pattern that is connected to at least one of the electronic component and the piezoelectric element on the circuit board; and
a solder land connected to the reference potential pattern on the circuit board,
wherein, on the circuit board, the solder land is located between the piezoelectric element and the electronic component, and the piezoelectric element is located on an upstream side in a transport direction of the circuit board with respect to a position of the solder land.

2. The electronic apparatus according to claim 1, wherein a resist of the reference potential pattern is partly removed so as to form the solder land.

3. The electronic apparatus according to claim 1, wherein, in a soldering process for mounting the electronic component and the piezoelectric element on the circuit board, a discharge current generated at the piezoelectric element due to a pyroelectric effect is caused to pass into the solder land and a discharge path formed by the reference potential pattern.

4. The electronic apparatus according to claim 3, wherein the electronic component and the piezoelectric element are located on the circuit board so that a straight line that connects the electronic component and the piezoelectric element is approximately orthogonal to the transport direction of the circuit board.

5. The electronic apparatus according to claim 1, wherein the solder land includes a pattern that is part of the reference potential pattern and that extends in the transport direction of the circuit board.

6. The electronic apparatus according to claim 1, wherein the solder land is a kind of land that is provided around the electronic component in order to restrain solder bridging.

7. The electronic apparatus according to claim 3, further comprising an elongating pattern that is elongated from a terminal of the piezoelectric element forward in the transport direction of the circuit board and that forms part of the discharge path.

8. The electronic apparatus according to claim 1, wherein the solder land is an elongating pattern that extends backward from one of a plurality of terminals of the piezoelectric element that is located at the end of the circuit board in the transport direction.

9. The electronic apparatus according to claim 8, wherein the elongating pattern is a pattern that brings the piezoelectric element and either a rectifier element or a driving element into conduction.

10. The electronic apparatus according to claim 1, wherein the shape and size of a terminal of the piezoelectric element are determined relative to a hole that is provided for insertion of the terminal in the circuit board, so that a side face of the terminal and an outer wall of the hole are brought into conduction or intimate contact with each other.

11. The electronic apparatus according to claim 10, wherein the length of a longest line segment of the terminal in horizontal section is longer than the length of a shortest line segment of the hole in horizontal section before the terminal is inserted into the hole.

12. The electronic apparatus according to claim 10, wherein the terminal is L-shaped in horizontal section.

13. The electronic apparatus according to claim 10, wherein a conductive member for conduction between the terminal and the hole is provided between the terminal and the hole.

14. An electronic apparatus comprising:
a circuit board with an electronic component and a piezoelectric element;
a reference potential pattern that is connected to at least one of the electronic component and the piezoelectric element on the circuit board; and
an elongating pattern connected to the reference potential, that extends from a terminal in transport direction of the circuit board, wherein the terminal is located in the most downstream side among a plurality of terminals of the piezoelectric element while the piezoelectric element is mounted on the circuit board.

15. The electronic apparatus according to claim 14, wherein a discharge current generated at the piezoelectric element due to a pyroelectric effect during mounting of the electronic component and the piezoelectric element is caused to pass into a discharge path formed by the piezoelectric element, the elongating pattern, and the reference potential pattern.

16. A high-voltage power supply that is installable on an image forming apparatus, comprising:
a circuit board with an electronic component and a piezoelectric element, the circuit board being transported so as to solder the electronic component and the piezoelectric element to the circuit board;
a reference potential pattern that is connected to at least one of the electronic component and the piezoelectric element on the circuit board; and
a solder land connected to the reference potential pattern on the circuit board,
wherein, on the circuit board, the solder land is located between the piezoelectric element and the electronic component, and the piezoelectric element is located on an upstream side in a transport direction of the circuit board with respect to a position of the solder land, and
a high voltage that is output from the piezoelectric element is applied to a process member of the image forming apparatus.

17. A printed circuit board including an electronic component and a piezoelectric element, the printed circuit board being transported so as to solder the electronic component and the piezoelectric element to the circuit board, the printed circuit board comprising:
a reference potential pattern that is connected to at least one of the electronic component and the piezoelectric element on a circuit board; and
a solder land connected to the reference potential pattern on the circuit board,
wherein, on the circuit board, the solder land is located between the piezoelectric element and the electronic component, and the piezoelectric element is located on an upstream side in a transport direction of the circuit board with respect to a position of the solder land.

18. The printed circuit board according to claim 17, wherein a discharge current generated at the piezoelectric element due to a pyroelectric effect of the piezoelectric element being caused to pass into a discharge path formed by the solder land and the reference potential pattern.

19. A printed circuit board comprising:
an electronic component;
a piezoelectric element;
a reference potential pattern that is connected to at least one of the electronic component and the piezoelectric element; and
an elongating pattern connected to the reference potential pattern, that extends from a terminal in a transport direction of the circuit board, wherein the terminal is located on the most downstream side among a plurality of terminals of the piezoelectric element while the piezoelectric element is mounted on the circuit board.

20. The printed circuit board according to claim 19, wherein a discharge current generated at the piezoelectric element due to a pyroelectric effect during mounting of the electronic component and the piezoelectric element is caused to pass into a discharge path formed by the piezoelectric element, the elongating pattern, and the reference potential pattern.

21. The electronic apparatus according to claim 1, wherein the electronic component is located on a downstream side in the transport direction of the circuit board with respect to the position of the solder land.

22. The electronic apparatus according to claim 14, further comprising other solder land located between the electronic component and the piezoelectric element.

23. The power supply according to claim 16, wherein the electronic component is located on a downstream side in the transport direction of the circuit board with respect to the position of the solder land.

24. The power supply according to claim 16, wherein the process member comprises a transfer roller for transferring an image on a sheet.

25. The printed circuit board according to claim 17, wherein the electronic component is located on a downstream side in the transport direction of the circuit board with respect to the position of the solder land.

26. The printed circuit board according to claim 19, further comprising other solder land located between the electronic component and the piezoelectric element.

27. A electronic apparatus comprising:
a circuit board with an electronic component and a piezoelectric element;
a reference potential pattern that is connected to at least one of the electronic component and the piezoelectric element on the circuit board; and
a solder land connected to the reference potential pattern on the circuit board,
wherein the solder land is located between the electronic component and the piezoelectric element.

28. A printed circuit board comprising:
- an electronic component;
- a piezoelectric element;
- a reference potential pattern that is connected to at least one of the electronic component and the piezoelectric element on the circuit board; and
- a solder land connected to the reference potential pattern on the circuit board,
- wherein the solder land is located between the electronic component and the piezoelectric element.

29. A high-voltage power supply that is installable on an image forming apparatus, comprising:
- a circuit board with an electronic component and a piezoelectric element;
- a reference potential pattern that is connected to at least one of the electronic component and the piezoelectric element on the circuit board; and
- a solder land connected to the reference potential pattern on the circuit board,
- wherein the solder land is located between the electronic component and the piezoelectric element.

30. A method of soldering an electronic component and a piezoelectric element on a printed circuit board, the method comprising the steps of
- mounting the electronic component and the piezoelectric element on the printed circuit board having a reference potential pattern and a solder land connected to the reference potential pattern, such that the solder land is located between the electronic component and the piezoelectric element, and
- soldering the electronic component and the piezoelectric element on the printed circuit board by transporting to a solder jet flow the printed circuit board on which the electronic component and the piezoelectric element is mounted.

31. The method according to claim 30, further comprising the step of mounting the electronic component on the printed circuit board on a downstream side in a transport direction of the printed circuit board with respect to a mount position of the solder land.

* * * * *